US009508723B2

United States Patent
Lee et al.

(10) Patent No.: US 9,508,723 B2
(45) Date of Patent: Nov. 29, 2016

(54) SEMICONDUCTOR DEVICE HAVING BURIED GATE AND MANUFACTURING METHOD THEREOF

(71) Applicant: SK HYNIX INC., Icheon (KR)

(72) Inventors: Sang Gon Lee, Seoul (KR); Sun Joo Park, Seoul (KR)

(73) Assignee: SK HYNIX INC., Icheon (KR)

( * ) Notice: Subject to any disclaimer, the term of this patent is extended or adjusted under 35 U.S.C. 154(b) by 128 days.

(21) Appl. No.: 14/332,317

(22) Filed: Jul. 15, 2014

(65) Prior Publication Data

US 2015/0255464 A1 Sep. 10, 2015

(30) Foreign Application Priority Data

Mar. 5, 2014 (KR) .................. 10-2014-0025997

(51) Int. Cl.
*H01L 27/108* (2006.01)
*H01L 29/66* (2006.01)
*H01L 29/423* (2006.01)

(52) U.S. Cl.
CPC ... *H01L 27/10823* (2013.01); *H01L 27/10876* (2013.01); *H01L 27/10885* (2013.01); *H01L 29/4236* (2013.01); *H01L 29/4238* (2013.01); *H01L 29/66545* (2013.01)

(58) Field of Classification Search
CPC .............. H01L 27/10823; H01L 27/10885; H01L 27/10876; H01L 29/66545
USPC ............................................. 438/83; 257/330
See application file for complete search history.

(56) References Cited

U.S. PATENT DOCUMENTS

| 2009/0004855 A1* | 1/2009 | Lee ................... H01L 21/76895 438/669 |
| 2009/0159978 A1* | 6/2009 | Matsubara ........ H01L 21/76897 257/368 |
| 2010/0181623 A1* | 7/2010 | Im ....................... H01L 27/0207 257/368 |
| 2012/0211813 A1* | 8/2012 | Taketani ........... H01L 27/10814 257/296 |
| 2013/0099298 A1* | 4/2013 | Kim .................. H01L 29/42356 257/296 |
| 2013/0148409 A1 | 6/2013 | Chung |

FOREIGN PATENT DOCUMENTS

KR  10-0861209 B1  9/2008
KR  10-2010-0079056 A  7/2010

* cited by examiner

Primary Examiner — David S Blum

(57) ABSTRACT

A dummy active region is formed in a region in which a gate contact for supplying operation power to the buried gate is formed, and a PN junction diode connected to the gate contact in a reverse bias direction is formed in the dummy active region. Current leakage, in which current flows out toward a substrate, is prevented even when misalignment of the gate contact occurs.

12 Claims, 10 Drawing Sheets

(a)

(b)

SEMICONDUCTOR DEVICE HAVING BURIED GATE AND MANUFACTURING METHOD THEREOF

CROSS-REFERENCE TO RELATED APPLICATION

The present application claims priority to Korean patent application number 10-2014-0025997, filed on Mar. 5, 2014, which is incorporated by reference herein in its entirety.

BACKGROUND OF THE INVENTION

1. Technical Field

This disclosure relates to a semiconductor device having a buried gate.

2. Related Art

In recent years, manufacturing methods of semiconductor devices such as dynamic random access memories (DRAMs) have been developed to improve the degree of integration. Thus, various methods have been investigated to ensure reliability of semiconductor devices while the degree of integration increases by applying a buried gate.

Buried gate structures may considerably reduce parasitic capacitance between a gate and a bit line by burying the gate in an active region. Therefore, sensing margins of memory devices are improved by applying a buried gate.

However, when a buried gate is applied, since a distance between a metal line and the buried gate is increased, misalignment is more likely to occur when a contact which connects a sub word line driver and the buried gate, is formed.

When misalignment of the contact occurs, the contact and a substrate are connected, which may cause current leakage in which current flows out to the substrate.

SUMMARY

Embodiments may prevent current leakage, in which current flows out toward a substrate when misalignment of a contact for connection between a sub word line driver and a buried gate occurs.

According to an aspect of an embodiment, there is a semiconductor device having a buried gate. The semiconductor device may include a device isolation layer defining an active region and a dummy active region, a gate buried in the active region, the dummy active region, and the device isolation layer, and a gate contact coupled to a portion of the gate buried in the dummy active region. The dummy active region may include a P-type impurity region and an N-type impurity region in contact with the P-type impurity region.

According to an aspect of an embodiment, there is a method of manufacturing a semiconductor device. The method may include forming a device isolation layer defining an active region and a dummy active region, forming a trench by etching the active region, the dummy active region, and the device isolation layer, forming a gate in the trench, forming a PN junction diode in the dummy active region by implanting impurities into the dummy active region, and forming a gate contact coupled to a portion of the gate buried in the dummy active region.

The embodiments may prevent current leakage in which current flows out toward a substrate from being caused even when misalignment of a contact MOC which connects a sub word line driver and a buried gate occurs.

These and other features, aspects, and embodiments are described below.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
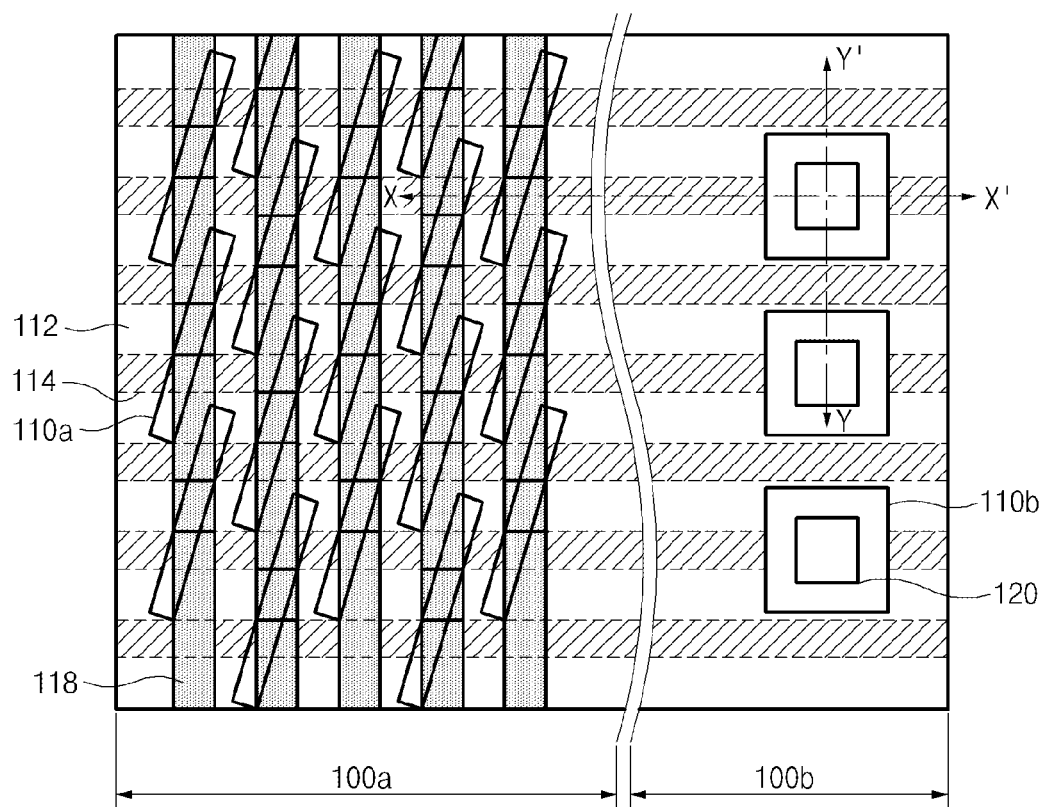
FIG. 1 is a plan view illustrating a structure of a semiconductor device according to an embodiment.

Hereinafter, embodiments will be described in greater detail with reference to the accompanying drawings.

Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments are not limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
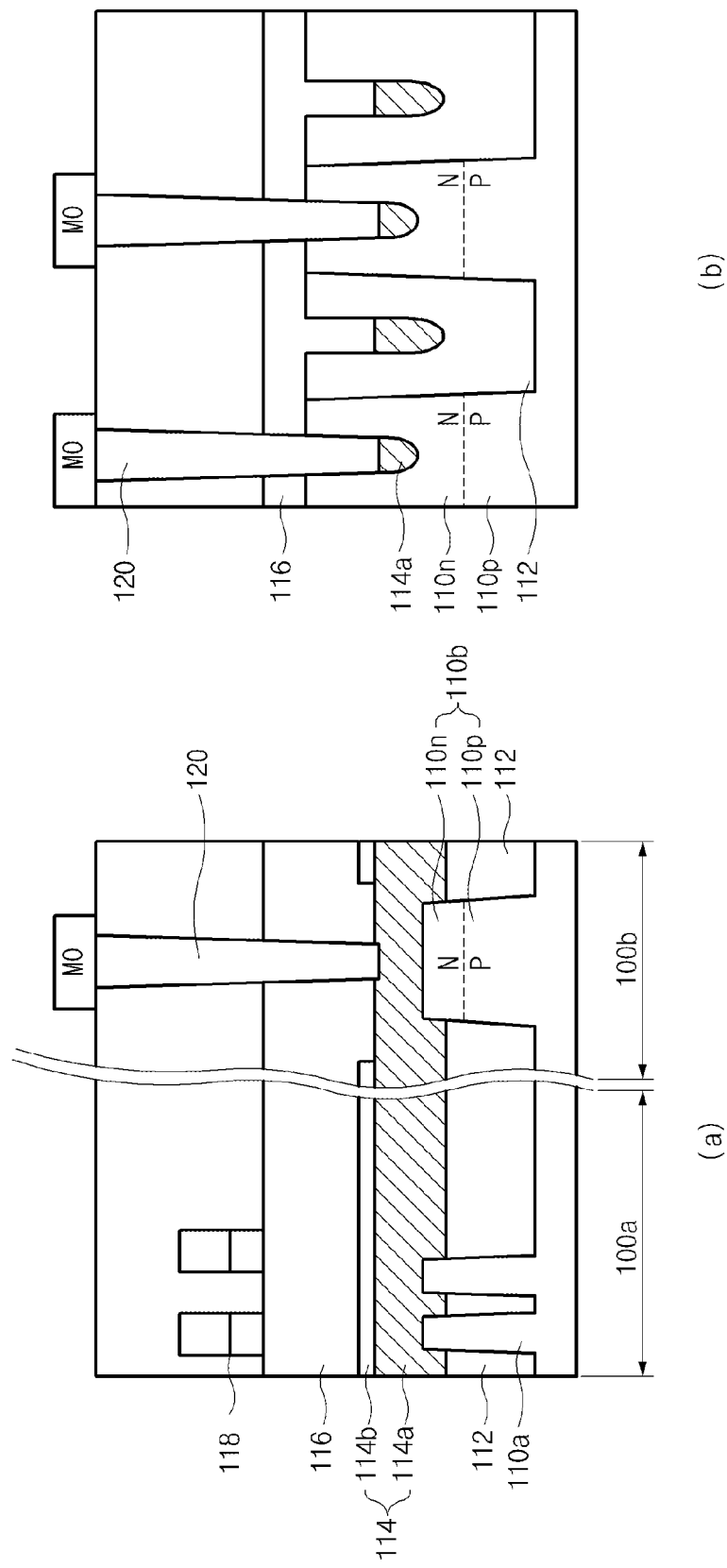
FIGS. 2A and 2B are cross-sectional views illustrating structures of the semiconductor device taken along lines X-X' and Y-Y' of FIG. 1.

FIG. 1 is a plan view illustrating a structure of a semiconductor device according to an embodiment. FIGS. 2A and 2B are cross-sectional views illustrating structures of the semiconductor device taken along lines X-X' and Y-Y' of FIG. 1. The embodiment shown in the drawings has a $6F^2$ layout.

In an embodiment, a semiconductor device may include a first region 100a which includes a cell array, and a second region 100b which includes a gate contact 120 that connects a buried gate 114 to a sub word line driver (SWD) through a metal line (MO). The first region 100a may be a cell region, and a second region 100b may be a peripheral circuit region. In another embodiment, second region 100b may be a region between the cell region and the peripheral circuit region.

Active regions 110a may be defined by a device isolation layer 112. A plurality of cell transistors may be disposed in active region 110a in the first region 100a. Meanwhile, a plurality of dummy active regions 110b, which are defined by the device isolation layer 112, are disposed in the second region 100b. A dummy active region may be a doped region in a semiconductor device which does not convey a charge between circuit structures and a substrate. In an embodiment, the primary purpose of a dummy active region is to prevent leak currents associated with a misaligned gate contact.

A line type buried gate 114 may run over the active region 110a, the dummy active region 110b, and the device isolation layer 112. In addition, line type buried gate 114 may cross the active region 110a at an oblique angle. In an embodiment, the buried gate 114 may have a stacked structure including a second gate electrode 114b stacked on top of a first gate electrode 114a. In addition, the buried gate 114 may have a structure in which a portion of the second gate electrode 114b is selectively removed around the dummy active region 110b. The first gate electrode 114a may include a metal conductive layer such as tungsten (W), and the second gate electrode 114b may include a polysilicon layer. The first gate electrode 114a may be formed to be deeper in the device isolation layer 112 than in the active region 110a. Thus, as seen in FIG. 2A, the first gate electrode 114a may cover a top surface and upper portions of sidewalls of the active region 110a.

In an embodiment, an impurity region 110n has N-type impurities implanted to a depth corresponding to a bottom of the first gate electrode 114a or a depth deeper than the bottom of the first gate electrode 114a. The buried gate 114 is disposed in impurity region 110n, which constitutes an upper portion of the dummy active region 110b. A first impurity region 110p, which is lower portion of dummy active region 110b, is doped with P-type impurities. Accordingly, the dummy active region 110b may include a first impurity region 110p which is doped with P-type impurities, and a second impurity region 110n which is in contact with the first impurity region 110p and includes N-type impurities. Therefore, the dummy active region 110b may have a PN junction diode structure in which the first impurity region 110p and the second impurity region 110n are connected and form a depletion zone. Further, since the N-type impurity region 110n of the dummy active region 110b is connected to the first gate electrode 114a and the P-type impurity region 110p of the dummy active region 110b is connected to a substrate, current will not flow from upper interconnection structures into the substrate. More specifically, when a contact 120 is misaligned so that it is not insulated from the dummy active region 110b, the junction of first impurity region 100p and second impurity region 100n acts as a PN diode that is biased to prevent current through the contact from leaking out to the substrate.

An insulating layer 116 is disposed over the buried gate 114, the active region 110a, the dummy active region 110b, and the device isolation layer 112 in the first region 100a and the second region 100b. The insulating layer 116 may be a nitride layer. More specifically, insulating layer 116 may be a sealing nitride layer.

A bit line 118, which may have a stacked structure of a conductive line and a hard mask layer, is disposed over the insulating layer 116 in the first region 100a. The bit line 118 perpendicularly crosses the buried gate 114 and crosses the active region 110a at an oblique angle. The gate contact 120, which connects the first gate electrode 114a and the metal line MO, is formed on the first gate electrode 114a buried in the second region 100n of the dummy active region 110b. Accordingly, even when misalignment of the gate contact 120 causes a portion of the gate contact 120 to contact or otherwise be electrically coupled to the dummy active region 110b, current of the gate contact 120 does not flow out toward the substrate due to a reverse bias of the PN junction diode in the dummy active region 110b.

FIGS. 3 to 9 are cross-sectional views illustrating processes of manufacturing the semiconductor device in FIGS. 2A and 2B.

Figure 3:
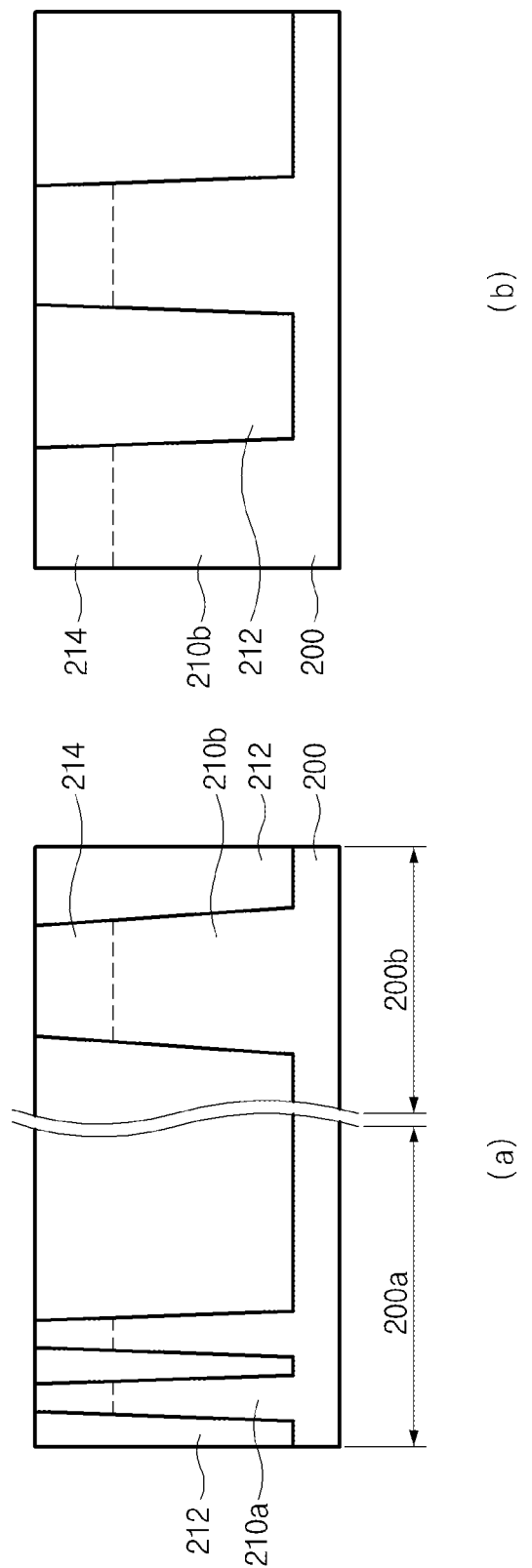
FIGS. 3 to 9 are cross-sectional views illustrating processes for manufacturing the structures of FIGS. 1, 2A, and 2B.

First, referring to FIG. 3, a first region 200a and a second region 200b of a semiconductor substrate 200 are etched, and a device isolation layer 212 which defines an active region 210a and a dummy active region 210b is formed. The active region 210a of the first region 200a may include a plurality of cell transistors. The semiconductor substrate 200 may include a semiconductor substrate into which P-type impurities are implanted.

In an embodiment, a pad oxide layer (not shown) and a pad nitride layer (not shown) are formed over the semiconductor substrate 200, and a photoresist layer (not shown) is formed over the pad nitride layer. The pad oxide layer may suppress stress of the pad nitride layer from being transferred to the semiconductor substrate.

Next, an exposure and development process is performed on the photoresist layer to form a photoresist pattern (not shown) which defines the active region 210a and the dummy active region 210b. The pad nitride layer, the pad oxide layer, and the semiconductor substrate are sequentially etched using the photoresist pattern as an etch mask to form a device isolation trench (not shown) which defines the active region 210a and the dummy active region 210b. Subsequently, N-type impurities are implanted into upper portions of the active region 210a and the dummy active region 210b to form a preliminary impurity region 214.

Next, an insulating material for device isolation is formed in the device isolation trench to form the device isolation layer 212 which defines the active region 210a and the dummy active region 210b. The device isolation layer 212 may be formed of an insulating material having a good gap-fill characteristic, for example, a silicon on dielectric (SOD) material or a high-density plasma (HDP) oxide layer. In another embodiment, the device isolation layer 212 may be formed of a nitride layer or have a stacked structure of an oxide layer and a nitride layer.

Figure 4:
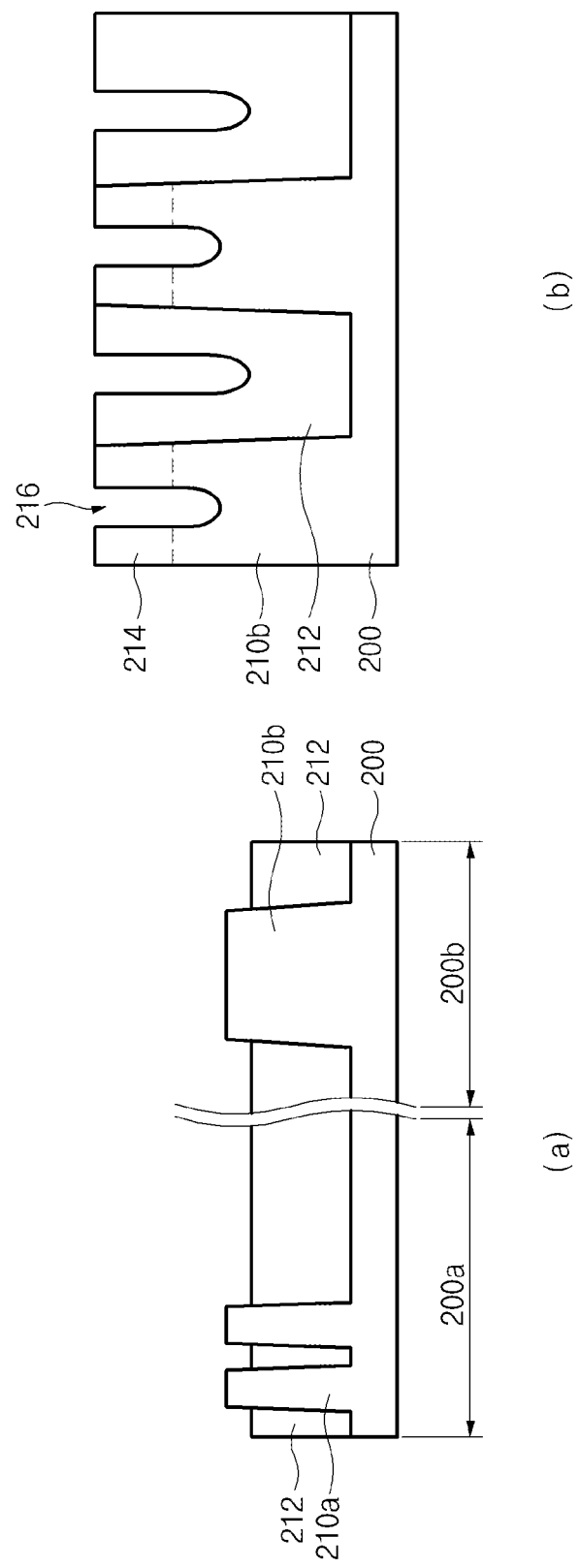

Referring to FIG. 4, a hard mask pattern (not shown), which defines a buried gate region, is formed over the active region 210a, the dummy active region 210b, and the device isolation layer 212. The hard mask pattern may include a nitride layer.

Next, the active region 210a, the dummy active region 210b, and the device isolation layer 212 are etched using the hard mask pattern as an etch mask to form gate trenches 216. The preliminary impurity region 214 in the active region 210a is divided into a source region and a drain region by gate trench 216. In an embodiment, the device isolation layer 212 in the gate trench 216 is etched to be deeper than the active region 210a and the dummy active region 210b due to etch selectivity between the substrate and the device isolation layer. Therefore, the gate trench 216 may have a fin structure in which the active region 210a and the dummy active region 210b protrude rather than the device isolation layer 212.

Figure 5:
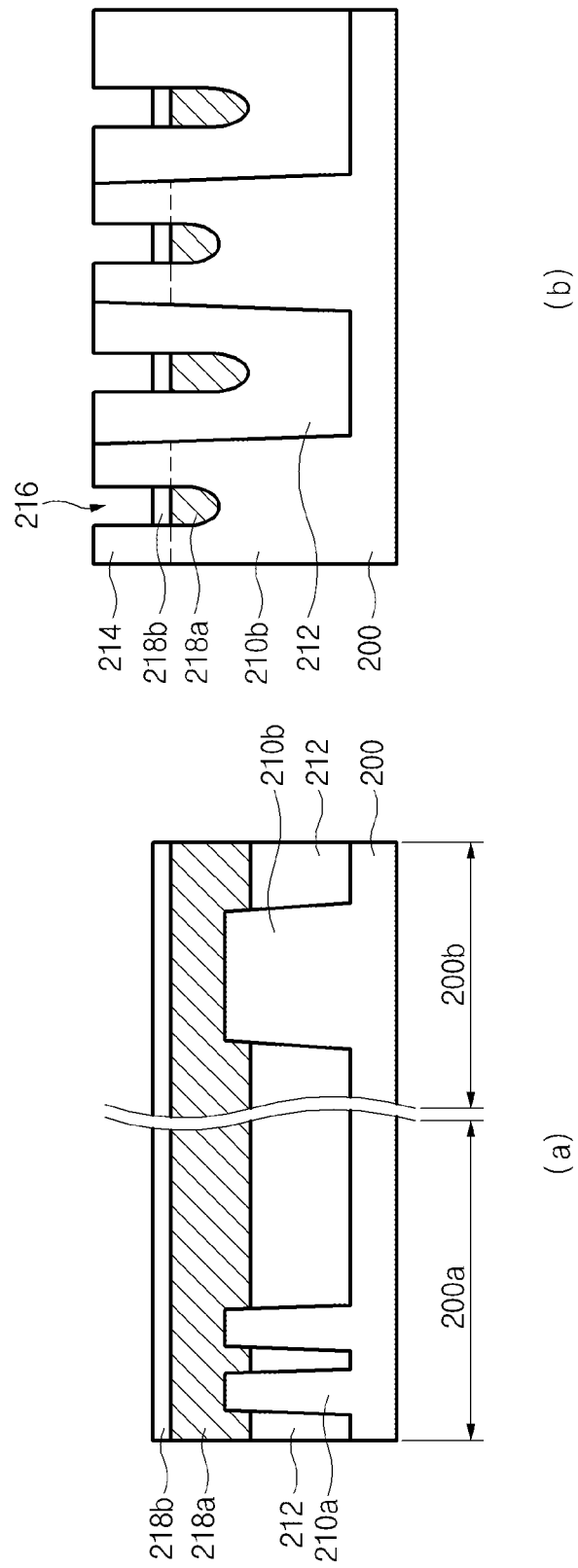

Referring to FIG. 5, a gate insulating layer (not shown) is formed over a surface of the substrate exposed by the gate trench 216. The gate insulating layer may be formed by depositing a high-k material such as silicon oxide (SiO), oxide-nitride-oxide (ONO), hafnium oxide ($HfO_2$), or zirconium oxide (ZrO) or a lead zirconate titanate (PZT) material through a chemical vapor deposition (CVD) process. The gate insulating layer may be formed by heating the substrate in a furnace. Alternatively, the gate insulating layer may be formed by depositing a high-k material such as zirconium (Zr) or Hafnium (Hf) on an inner surface of the trench through an atomic layer deposition (ALD) process and oxidizing the high-k material.

A first gate electrode material is deposited in the gate trench 216 in which the gate insulating layer is formed, and then etched back, and thus the first gate electrode material is left only in a lower portion of the trench to a certain height to form a first buried gate electrode 218a. The first gate electrode material may include a metal such as tungsten (W).

Next, a second gate electrode material is deposited in the gate trench 216, and then etched back to form a second buried gate electrode 218b over the first buried gate electrode 218a. The second gate electrode material may include polysilicon.

Figure 6:
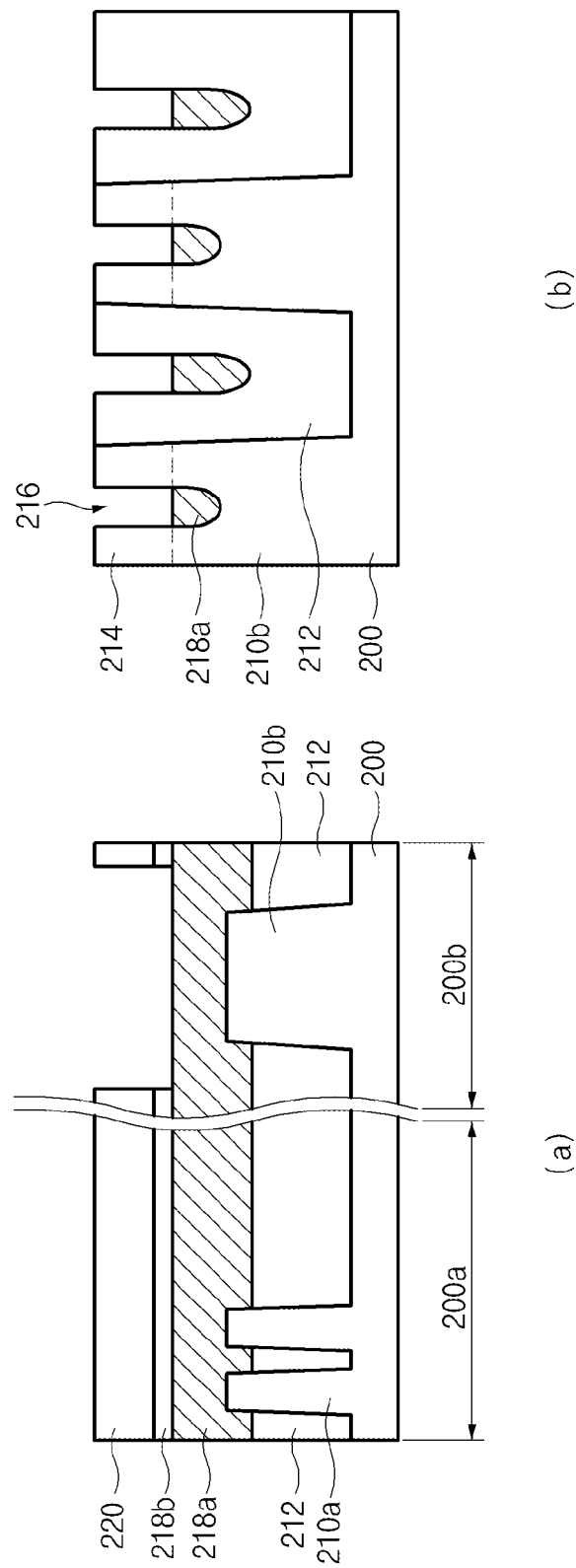

Referring to FIG. 6, a photoresist pattern 220, which exposes a region corresponding to the dummy active region 210b, is formed over the first region 200a and the second region 200b. Portions of the second buried gate 218b formed over the dummy active region 210b are selectively removed using the photoresist pattern 220. That is, since contact resistance is increased when a gate contact formed in a subsequent process is connected to the second buried gate electrode 218b, a portion of the second buried gate electrode 218b formed in the dummy active region 210b is selectively removed so that the gate contact is directly connected to the first buried gate electrode 218a which is a metal material. The photoresist pattern 220 may be formed to expose dummy active regions 210b in the second region 200b.

Figure 7:
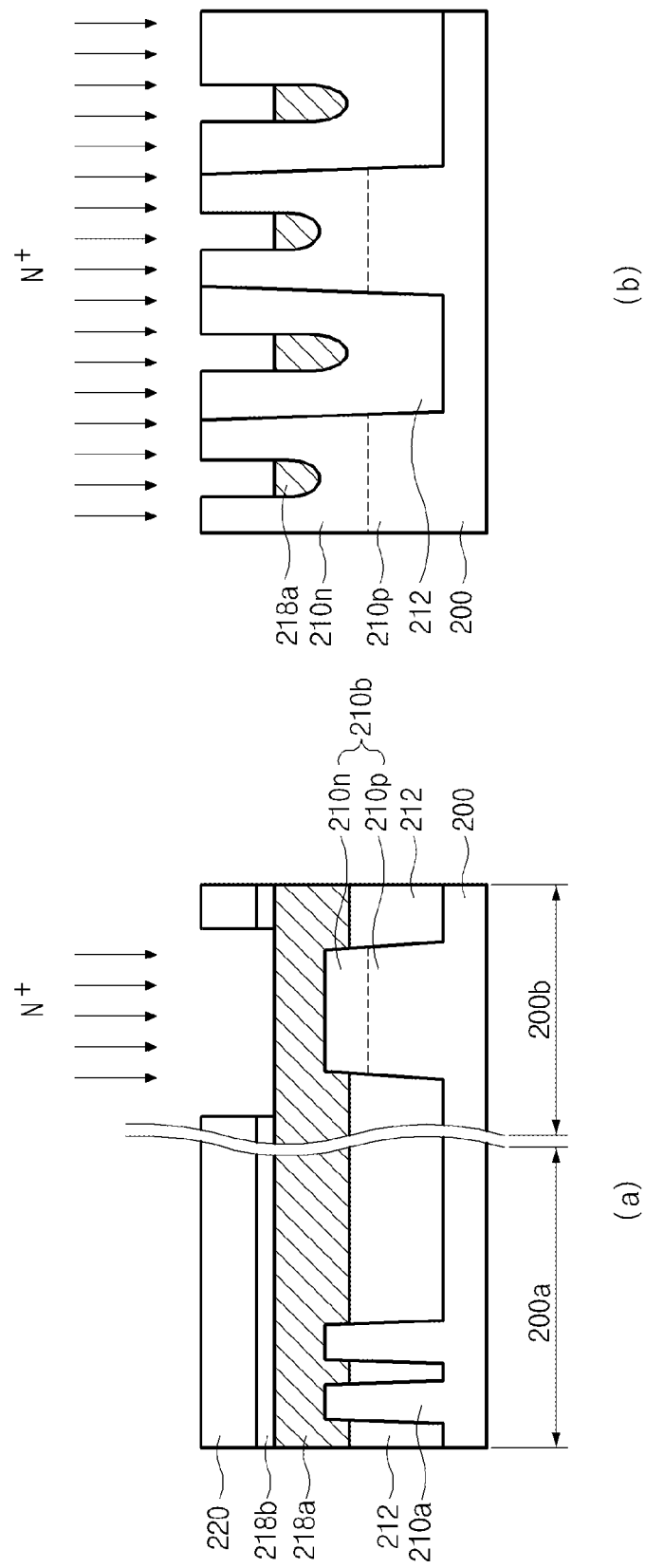

Referring to FIG. 7, $N^+$-type impurities are implanted into the dummy active region 210b to form an impurity region 210n in an upper portion of the dummy active region 210b. In an embodiment, the $N^+$-type impurities are implanted into a structure of FIG. 6 using the photoresist pattern 220 to form the N-type impurity region 210n in the upper portion of the dummy active region 210b. The N-type impurity implantation process may include implanting impurities in the N-type impurity region 210n to have a depth corresponding to a bottom of the first buried gate electrode 218a in the dummy active region 210b. In another embodiment, a lower end of N-type impurity region 210n is lower than a bottom surface of subsequently formed first gate electrode 218a. That is, the N-type impurity region 210n is formed so that the first buried gate 218a is buried in the N-type impurity region 210n in the dummy active region 210b.

An earlier process of doping N-type impurities may have already been performed as explained above with respect to FIG. 3. Thus, the second N doping process shown in FIG. 7 may extend the depth of the N-type impurities to a second depth below the initial depth. Because photoresist pattern 220 covers the first region 200a, the second N-type impurity doping is selectively applied to the second region 200b, so that the depth of $N^+$ doped second impurity regions 210n are greater than a depth of the preliminary impurity region 214 in first region 200a.

A resulting dummy active region 210b has a structure in which a first impurity region 210p including P-type impurities is adjacent to a second impurity region 210n including N-type impurities. That is, the dummy active region 210b has a PN junction diode structure in which the N-type impurity region 210n is coupled to the first buried gate electrode 218a, and the P-type impurity region 210p is coupled to the substrate 200. Therefore, even when a gate contact formed in a subsequent process is not accurately landed to the first buried gate electrode 218a due to misalignment of the gate contact, and the gate contact is coupled to the dummy active region 210b, directional characteristics of the PN diode prevent current of the gate contact from flowing out to the substrate 200.

Figure 8:
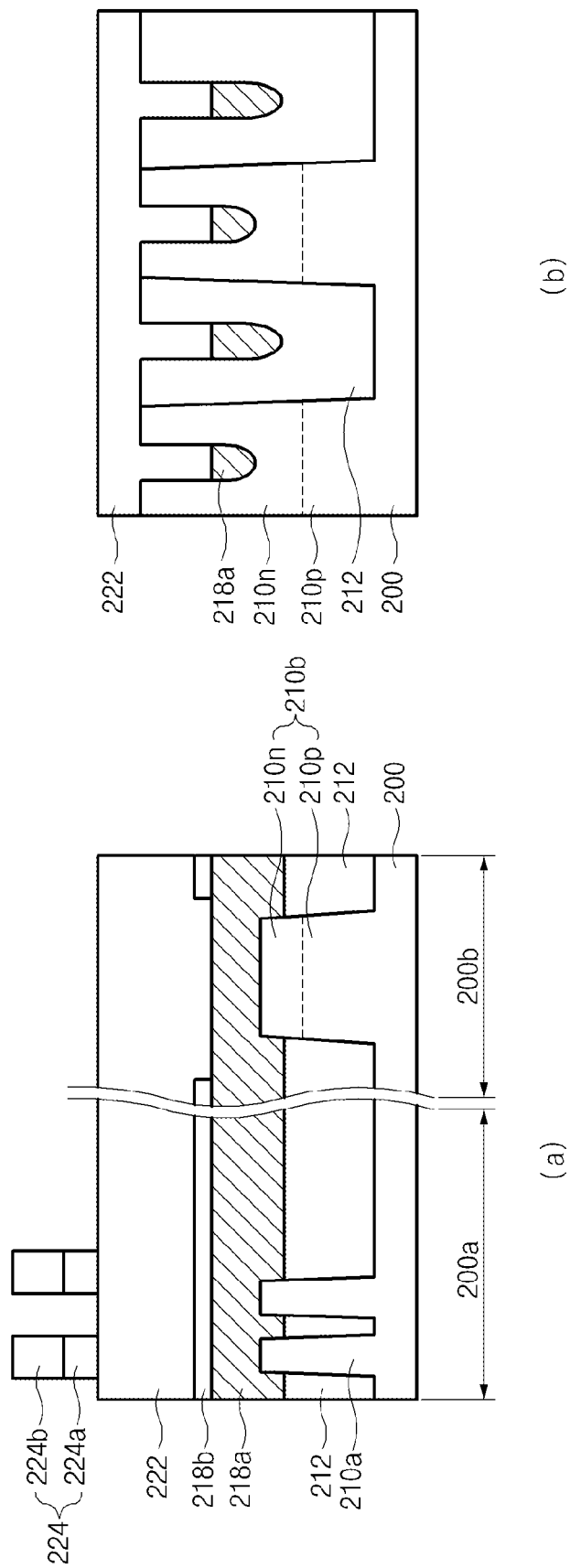

Referring to FIG. 8, the photoresist pattern 220 is removed, and an insulating layer 222 is formed over the first region 200a and the second region 200b. For example, an insulating material may be deposited over exposed surfaces of the first region 200a and the second region 200b to fill gate trenches 216, thereby forming insulating layer 222. The gate insulating layer 222 may include a nitride material.

The insulating layer 222 is etched to expose the active region 210a in the first region 200a, and thus a bit line contact hole (not shown) is formed. Then, a conductive material is formed in the bit line contact hole to form a bit line contact (not shown). Subsequently, a conductive layer for a bit line and a hard mask layer are formed on the bit line contact and the insulating layer 222, and are patterned to form a bit line 224 having a stacked structure of a conductive pattern 224a and the hard mask pattern 224b.

Figure 9:
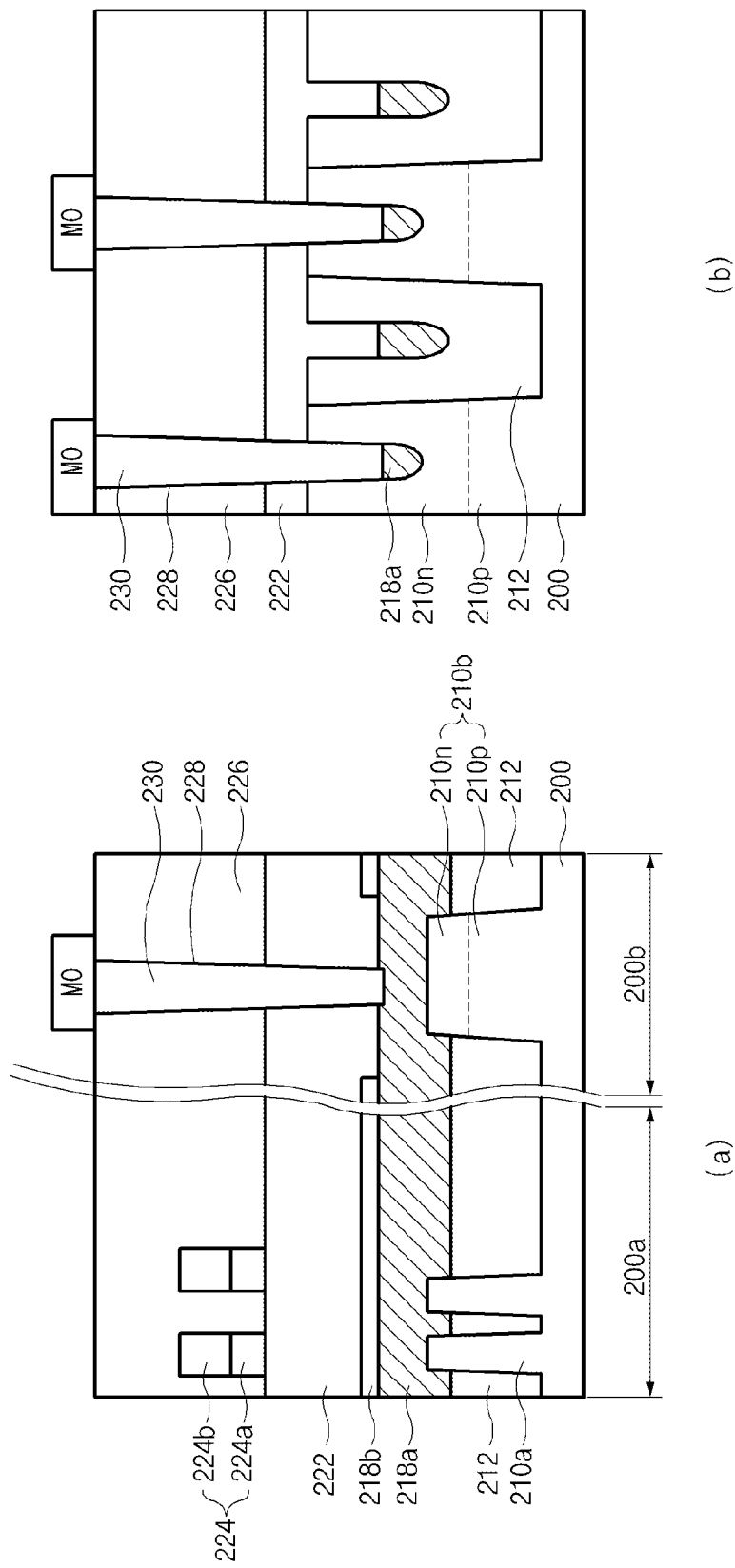

Referring to FIG. 9, an interlayer insulating layer 226 is formed in the first region 200a and the second region 200b, and then a portion of the interlayer insulating layer 226 in the second region 200b is etched to form a gate contact hole 228. The gate contact hole 228 is formed to expose the first buried gate 218a in the dummy active region 210b.

Subsequently, a conductive material is formed in the gate contact hole 228 to form a gate contact 230.

A metal layer (not shown) is formed on the interlayer insulating layer 226 including the gate contact 230, and the metal layer is patterned to form a metal line (MO) connected to gate contacts 230. The metal line (MO) may be coupled to a sub word line driver (SWD) (not shown) of a core region.

Figure 10:
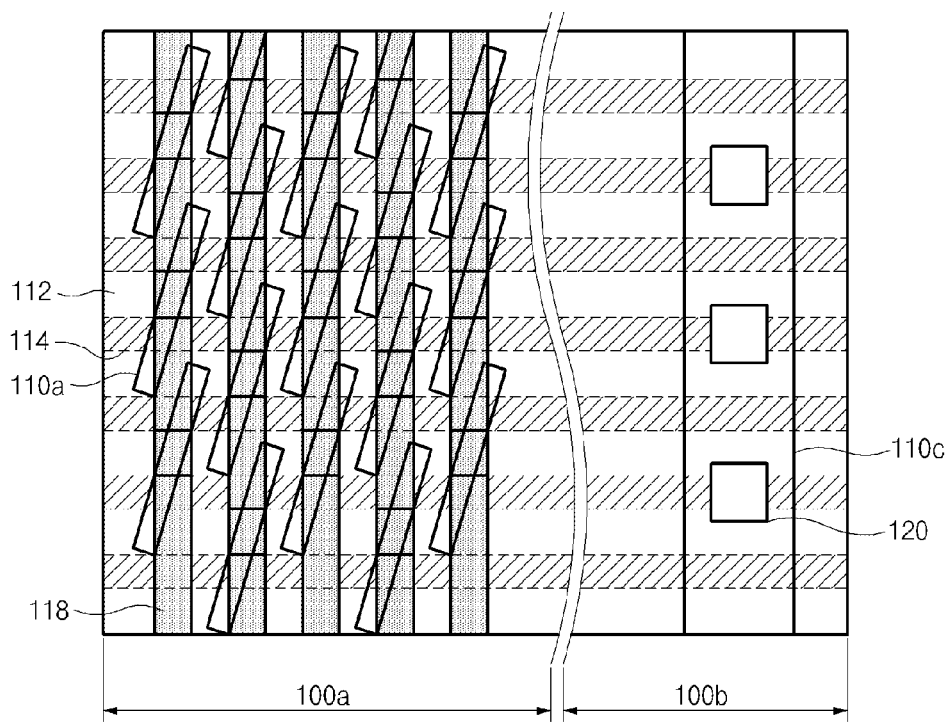
FIG. 10 is a plan view illustrating a structure of a semiconductor device according to another embodiment.

FIG. 10 is a plan view illustrating a structure of a semiconductor device according to another embodiment.

As described above with respect to the embodiment of FIG. 1, the dummy active region 110b may be formed as an island type in which only one gate 144 is buried in each individual island of dummy active region 110b. In embodiments of the present disclosure, a single contact 120 may be disposed over each separate island type dummy active region 110b.

In contrast to the embodiment of FIG. 1, in the embodiment of FIG. 10, a line type dummy active region 110c extends in parallel to a bit line 118. A plurality of buried gates 114 are buried in a single line type dummy active region 110c, and a plurality of gate contacts 120 are formed over the line type dummy active region 110c. A line type dummy active region 110c may reduce process complexity versus island type dummy active regions 110b.

Embodiments that are described above are illustrative and not limitative. Various alternatives and equivalents are possible. The scope of the claims is necessarily limited to the embodiments described herein. Nor are embodiments limited to any specific type of semiconductor device. Other additions, subtractions, or modifications are obvious in view of the present disclosure and are intended to fall within the scope of the appended claims.

What is claimed is:

1. A semiconductor device comprising:
   a device isolation layer defining an active region and a dummy active region;
   a gate buried in the active region, the dummy active region, and the device isolation layer; and
   a gate contact coupled to a portion of the gate buried in the dummy active region,
   wherein the dummy active region includes a P-type impurity region and an N-type impurity region disposed on the P-type impurity region, and
   wherein the N-type impurity region is disposed at both sides of the gate and under the gate.

2. The semiconductor device of claim 1, wherein the gate has a stacked structure of a first gate electrode and a second gate electrode, and portions of the second gate electrode are not disposed in the dummy active region.

3. The semiconductor device of claim 2, wherein the first gate electrode includes a metal, and the second gate electrode includes polysilicon.

4. The semiconductor device of claim 1, wherein the dummy active region is an island type active region in which one gate is buried.

5. The semiconductor device of claim 1, wherein the dummy active region is a line type active region in which a plurality of gates is buried.

6. The semiconductor device of claim 5, wherein the dummy active region is parallel to a bit line.

7. The semiconductor device of claim 1, wherein a portion of the gate in the device isolation layer has a greater depth than a portion of the gate in the active region, and surfaces of the gate extend over sidewalls of the active region at a transition between the active region and the device isolation layer.

8. A semiconductor device comprising:
    a buried gate disposed in a trench in an active region and a dummy active region;
    a gate contact coupled to a portion of the buried gate in the dummy active region; and
    a PN diode in the dummy active region,
    wherein the PN diode includes a P-type impurity region and an N-type impurity region disposed on the P-type impurity region, and
    wherein the N-type impurity region is disposed at both sides of the buried gate and under the buried gate.

9. The semiconductor device of claim 8, wherein the buried gate includes a polysilicon upper gate electrode and a metal lower gate electrode.

10. The semiconductor device of claim 8, wherein a depletion zone of the PN diode is disposed at a depth that is the same or greater than a depth of a bottom surface of a portion of the buried gate in the dummy active region.

11. The semiconductor device of claim 8, wherein a depth of N-type impurities in the dummy active region is greater than a depth of N-type impurities in the active region.

12. The semiconductor device of claim 8, wherein the active region is disposed in a cell region of the semiconductor device, and the dummy region is disposed in a peripheral region of the semiconductor device.

* * * * *